US012431175B2

United States Patent
Xing et al.

(10) Patent No.: US 12,431,175 B2
(45) Date of Patent: Sep. 30, 2025

(54) SELF-REFERENCE STORAGE STRUCTURE AND IN-MEMORY COMPUTING CIRCUIT

(71) Applicant: INSTITUTE OF MICROELECTRONICS OF THE CHINESE ACADEMY OF SCIENCES, Beijing (CN)

(72) Inventors: Guozhong Xing, Beijing (CN); Huai Lin, Beijing (CN); Yu Liu, Beijing (CN); Kaiping Zhang, Beijing (CN); Kangwei Zhang, Beijing (CN); Hangbing LV, Beijing (CN); Changqing Xie, Beijing (CN); Qi Liu, Beijing (CN); Ling Li, Beijing (CN); Ming Liu, Beijing (CN)

(73) Assignee: INSTITUTE OF MICROELECTRONICS OF THE CHINESE ACADEMY OF SCIENCES, Beijing (CN)

( * ) Notice: Subject to any disclaimer, the term of this patent is extended or adjusted under 35 U.S.C. 154(b) by 290 days.

(21) Appl. No.: 18/247,446

(22) PCT Filed: Jan. 4, 2021

(86) PCT No.: PCT/CN2021/070110
§ 371 (c)(1),
(2) Date: Mar. 30, 2023

(87) PCT Pub. No.: WO2022/073311
PCT Pub. Date: Apr. 14, 2022

(65) Prior Publication Data
US 2024/0005974 A1 Jan. 4, 2024

(30) Foreign Application Priority Data
Oct. 10, 2020 (CN) .......................... 202011077197.0

(51) Int. Cl.
*G11C 11/00* (2006.01)
*G11C 11/16* (2006.01)

(52) U.S. Cl.
CPC ........ *G11C 11/161* (2013.01); *G11C 11/1659* (2013.01); *G11C 11/1673* (2013.01); *G11C 11/1675* (2013.01)

(58) Field of Classification Search
CPC ............. G11C 11/161; G11C 11/1659; G11C 11/1673; G11C 11/1675
See application file for complete search history.

(56) References Cited

U.S. PATENT DOCUMENTS 10,923,648 B2 * 2/2021 Ahmed ............... G11C 11/1675
2017/0169873 A1 * 6/2017 Appeltans ........... G11C 11/1657
(Continued)

FOREIGN PATENT DOCUMENTS

| CN | 106251896 A | 12/2016 |
| CN | 110660420 A | 1/2020 |
| CN | 111724840 A | 9/2020 |

OTHER PUBLICATIONS

First Office Action prepared by the State Intellectual Property Office of the P.R. China for 202011077197.0 May 25, 2022, 13 pages.
(Continued)

*Primary Examiner* — Pho M Luu
(74) *Attorney, Agent, or Firm* — Syncoda LLC; Feng Ma

(57) ABSTRACT

A self-reference storage structure includes: three transistors, including a first transistor T1, a second transistor T2, and a third transistor T3; and two magnetic tunnel junctions, including a first magnetic tunnel junction MTJ0 and a second magnetic tunnel junction MTJ1. The first magnetic tunnel junction MTJ0 is connected in series between the first transistor T1 and the second transistor T2, and the second magnetic tunnel junction MTJ1 is connected in series between the second transistor T2 and the third transistor T3.

(Continued)

When the first transistor T1, the second transistor T2 and the third transistor T3 are turned on, one-bit binary information is written; and when data is stored, one-bit binary write can be implemented only by applying an unidirectional current pulse.

8 Claims, 11 Drawing Sheets

(56) References Cited

U.S. PATENT DOCUMENTS

2018/0190899 A1  7/2018  Kim et al.
2019/0057731 A1* 2/2019  Lua .......................... H03K 3/45

OTHER PUBLICATIONS

Written Opinion prepared by the State Intellectual Property Office of the P.R. China for PCT/CN2021/070110, May 20, 2021, 12 pages.

* cited by examiner

SELF-REFERENCE STORAGE STRUCTURE AND IN-MEMORY COMPUTING CIRCUIT

CROSS-REFERENCE TO RELATED APPLICATIONS

The present application is a national stage of International Application No. PCT/CN2021/070110 filed on Jan. 4, 2021, which claims priority to Chinese Patent Application No. 202011077197.0 filed on Oct. 10, 2020. The disclosures of the above-referenced applications are hereby incorporated by reference in their entirety.

TECHNICAL FIELD

The present disclosure relates to the technical field of memories, and in particular to a self-reference storage structure and an in-memory computing circuit.

BACKGROUND

A core memory cell of magnetic random memory (MRAM) is a magnetic tunnel junction, and the magnetization switching of the magnetic tunnel junction requires an external applied magnetic field, and the tunneling magnetoresistance of the magnetic tunnel junction is relatively low. Therefore, the existing memory is not only not conducive to circuit integration, but also the writing process causes the device to have high power consumption and low read margin.

Therefore, how to obtain a memory with low power consumption, low time latency, and high read margin is a pressing technical problem.

SUMMARY

The object of present disclosure is at least in part to provide a self-reference storage structure and an in-memory computing circuit that overcome problems as mentioned above or at least partially solve these problems.

In one aspect of the present disclosure, a self-reference storage structure is provided. The self-reference storage structure may include:
  three transistors comprising: a first transistor, a second transistor and a third transistor;
  two magnetic tunnel junctions comprising: a first magnetic tunnel junction and a second magnetic tunnel junction;
  wherein the first magnetic tunnel junction is connected in series between the first transistor and the second transistor;
  the second magnetic tunnel junction is connected in series between the second transistor and the third transistor; and one bit of binary information is written when the first transistor, the second transistor and the third transistor are controlled to turn on.

In some embodiments, the first magnetic tunnel junction and the second magnetic tunnel junction both include:
  a spin-orbit coupling layer, a ferromagnetic free layer, a tunneling layer, a ferromagnetic reference layer and a top electrode, from bottom to top,
  wherein the ferromagnetic free layer and the ferromagnetic reference layer are both any one of following magnetic materials having perpendicular anisotropies: CoFeB, $Co_2FeAl$, Co, CoFe, $Fe_3GeTe_2$, and $Ni_3GeTe_2$.

In some embodiments, the self-reference storage structure further includes:
  a word line, a first bit line, a second bit line, a read/write control line and a source line;
  wherein a gate of the first transistor and a gate of the third transistor are both connected to the word line, and a gate of the second transistor is connected to the read/write control line;
  the top electrode of the first magnetic tunnel junction and the top electrode of the second magnetic tunnel junction are both connected to the source line; and
  a drain of the first transistor is connected to the first bit line, and a drain of the third transistor is connected to the second bit line.

In some embodiments, wherein a ratio of a field-like torque and a damping-like torque of the ferromagnetic free layer is controlled to satisfy a first preset condition when injecting a current to spin-orbit coupling layers of the first magnetic tunnel junction and the second magnetic tunnel junction through the word line, to achieve a deterministic magnetization switching without an action of an external applied auxiliary magnetic field, i.e., field-free magnetization switching, so that a deterministic switching of resistance states of the first magnetic tunnel junction and the second magnetic tunnel junction occurs.

In some embodiments, wherein an antisymmetric exchange interaction coefficient between the spin-orbit coupling layer and the ferromagnetic free layer is adjusted to satisfies $0.2\text{\textasciitilde}0.3\ mJ/m^2$; and
  wherein a ratio of a field-like torque and a damping-like torque of the ferromagnetic free layer is controlled to satisfy a second preset condition when injecting a current to spin-orbit coupling layers of the first magnetic tunnel junction and the second magnetic tunnel junction through the word line, to achieve a deterministic magnetization switching without an action of an external applied auxiliary magnetic field, i.e., field-free magnetization switching, so that a deterministic switching of resistance states of the first magnetic tunnel junction and the second magnetic tunnel junction occurs.

In some embodiments, wherein an initialization operation is performed before a write operation, and the initialization operation may include:
  turning on the first transistor and the third transistor, turning off the second transistor and the source line, and injecting an initialization current by applying a gate voltage to the word line, so that both of the first magnetic tunnel junction and the second magnetic tunnel junction generate a spin transfer torque effect, causing the first magnetic tunnel junction to form a first resistance state and the second magnetic tunnel junction to form a second resistance state, and the first resistance state and the second resistance state are opposite resistance states.

In some embodiments, wherein performing the write operation may include:
  turning on the first transistor, the second transistor and the third transistor, controlling the read/write control line to be at a high voltage level, so that both of the first magnetic tunnel junction and the second magnetic tunnel junction generate a spin-orbit torque effect, causing the first magnetic tunnel junction to form the second resistance state and the second magnetic tunnel junction to form the first resistance state; and
  applying a high voltage level to the word line to inject a write current pulse, enabling the first magnetic tunnel junction and the second magnetic tunnel junction to achieve the magnetization switching, so as to write data.

In another aspect of the present disclosure, an in-memory computing circuit is provided. The in-memory computing circuit may include:
a memory cell, an asymmetric sense amplifier, and a voltage generation circuit;
wherein the memory cell includes a plurality of self-reference storage structures connected in parallel, and generates a voltage difference between an induction voltage and a reference voltage under an action of a current;
the asymmetric sense amplifier includes two transistors of different sizes;
the voltage generation circuit is connected between the memory cell and the asymmetric sense amplifier for inputting the voltage difference between the induction voltage and the reference voltage into the asymmetric sense amplifier to implement data read operation and logic operation functions.

In some embodiments, performing the data read operation may include:
applying a supply voltage to the voltage generation circuit to enable the memory cell to output the voltage difference; and inputting the voltage difference into the asymmetric sense amplifier to enable two inverted output terminals of the asymmetric sense amplifier to generate, based on a difference in discharge rates of the two transistors of different sizes in the asymmetric sense amplifier, complementary outputs, so as to achieve data reading.

In some embodiments, performing the logic operation may include:
turning on any two self-reference storage structures in the memory cell; and based on storage states of said any two self-reference storage structures and two transistors of different sizes in the asymmetrically sense amplifier, outputting, by the asymmetric sense amplifier, a logic operation result.

One or more technical solutions of the self-reference storage structure provided in this disclosure include: three transistors, comprising: a first transistor, a second transistor, and a third transistor; two magnetic tunnel junctions, comprising: a first magnetic tunnel junction and a second magnetic tunnel junction; wherein the first magnetic tunnel junction is connected in series between the first transistor and the second transistor; the second magnetic tunnel junction is connected in series between the second transistor and the third transistor; when the first transistor, the second transistor and the third transistor are turned on, writing one bit of binary information is realized, so that when performing the data storage, only a unidirectional current needs to be applied to realize the writing of one bit of binary data, and the device has low time latency, low power consumption, and high reading margin during data writing, thereby realizing high precision and reliable reading.

One or more technical solutions of the in-memory computing circuit provided in this disclosure include: a memory cell, an asymmetric sense amplifier and a voltage generation circuit, wherein the memory cell includes a plurality of self-reference storage structures connected in parallel and generates a voltage difference between an induction voltage and a reference voltage under the action of the voltage generation circuit; the asymmetric sense amplifier includes two transistors of different sizes. The two branches of the voltage generation circuit respectively generate currents, which respectively pass through two magnetic tunnel junctions to achieve the voltage difference with a high read margin, and the voltage difference generated by the read data is fed into the asymmetric sense amplifier to achieve a logic operation function. The architecture uses self-reference storage structures to increase the voltage difference outputted by the memory cell, so as to achieve a high read margin and increase read reliability as well as arithmetic performance.

BRIEF DESCRIPTION OF THE DRAWINGS

Various other advantages and benefits will become clear to those of ordinary skill in the art by reading the detailed description of the preferred embodiment below. The accompanying drawings are used for the purpose of illustrating the preferred embodiment only and are not considered to be limiting of the present disclosure. Moreover, throughout the accompanying drawings, the same components are represented by the same reference graphics. In the accompanying drawings.

DETAILED DESCRIPTION

Exemplary embodiments of the present disclosure will be described in greater detail below with reference to the accompanying drawings. While exemplary embodiments of the present disclosure are shown in the accompanying drawings, it should be understood that the present disclosure can be implemented in various forms and should not be limited by the embodiments set forth herein. Rather, these embodiments are provided to enable a more thorough understanding of the present disclosure and to enable a complete communication of the scope of the present disclosure to those skilled in the art.

Figure 1:
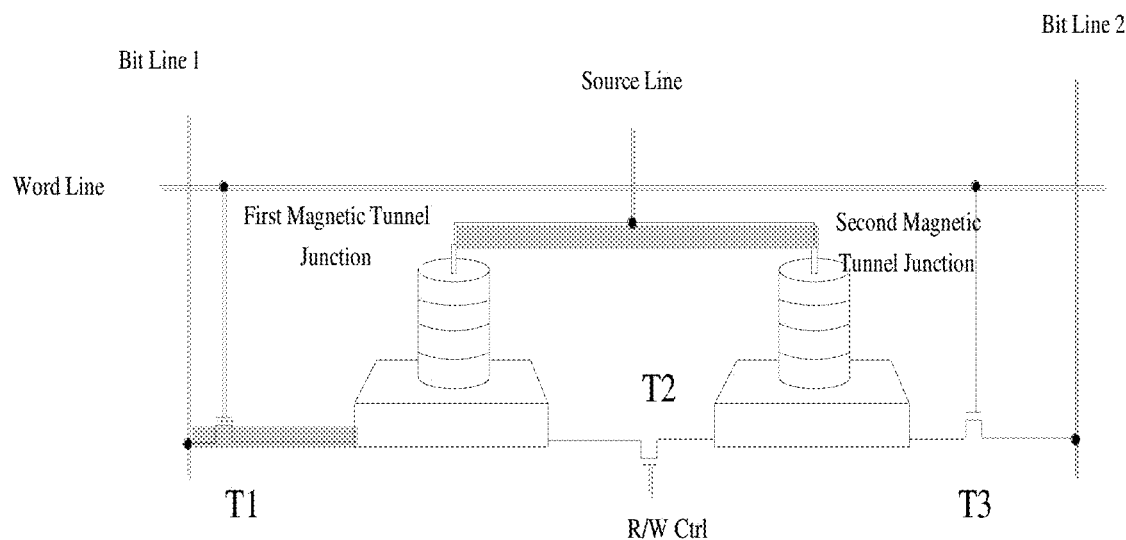
FIG. 1 is a schematic view of a self-reference storage structure according to one or more embodiments of the present disclosure.

According to an aspect of the present disclosure, there is provided a self-reference storage structure. As shown in FIG. 1, the self-reference storage structure may include: three transistors, including: a first transistor T1, a second transistor T2, and a third transistor T3; two magnetic tunnel junctions, including: a first magnetic tunnel junction MTJ0 and a second magnetic tunnel junction MTJ1, wherein the first magnetic tunnel junction MTJ0 is connected in series between the first transistor T1 and the second transistor T2; the second magnetic tunneling junction MTJ1 is connected in series between the second transistor T2 and the third transistor T3; and one bit of binary information is written when the first transistor T1, the second transistor T2, and the third transistor T3 are controlled to turn on.

Figure 2:
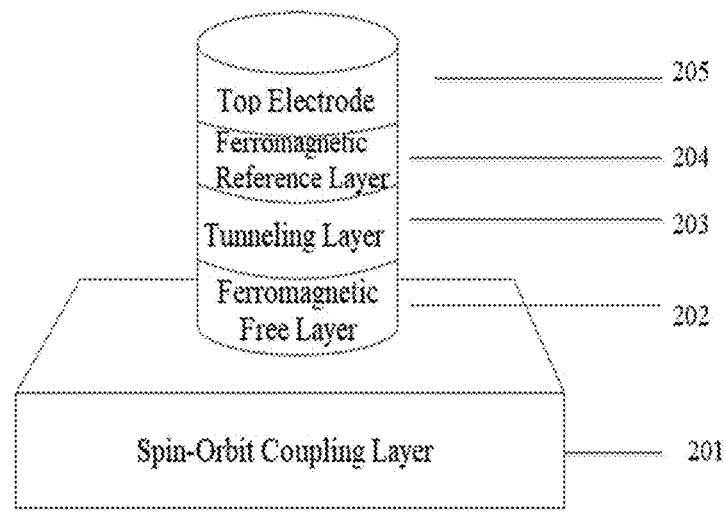
FIG. 2 is a schematic diagram of the structure of a magnetic tunnel junction according to one or more embodiments of the present disclosure.

As shown in FIG. 2, the first magnetic tunnel junction MTJ0 and the second magnetic tunnel junction MTJ1 both include:

a spin-orbit coupling layer (SOC Layer) 201, a ferromagnetic free layer (FL) 202, a tunneling layer 203, a ferromagnetic reference layer (RL) 204, and a top electrode 205 from bottom to top; wherein both of the ferromagnetic free layer 202 and the ferromagnetic reference layer 204 are any one of the following magnetic materials having perpendicular anisotropies. CoFeB, Co$_2$FeAl, Co, CoFe, Fe$_3$GeTe$_2$, and Ni$_3$GeTe$_2$.

The ferromagnetic free layer 202 and the ferromagnetic reference layer 204 have an easy magnetization direction perpendicular to the in-plane, which in turn facilitates the miniaturization of the device size and the fast magnetization switching.

As shown in FIG. 1, the self-reference storage structure further includes: a word line (WL), a first bit line BL1, a second bit line BL2, a read/write control line R/W Ctrl, and a source line (Source Line).

The gate of the first transistor T1 and the gate of the third transistor T3 are both connected to the WL, and a gate of the second transistor T2 is connected to the read/write control line R/W Ctrl; a top electrode of the first magnetic tunnel junction MTJ0 and a top electrode of the second magnetic tunnel junction MJT1 are both connected to the source line (Source Line); a drain of the first transistor T1 is connected to the first bit line BL1, and a drain of the third transistor T3 is connected to the second bit line BL2.

The first magnetic tunnel junction MTJ0 is connected in series between the first transistor T1 and the second transistor T2, and the second magnetic tunnel junction MTJ1 is connected in series between the second transistor T2 and the third transistor T3. The specific connections are as follows.

One end of the spin-orbit coupling layer (SOC Layer) 201 of the first magnetic tunnel junction MTJ0 is connected to a source of the first transistor T1 and the other end is connected to a drain (or a source) of the second transistor T2. One end of the spin-orbit coupling layer (SOC Layer) 201 of the second magnetic tunnel junction MTJ1 is connected to a source of the third transistor T3 and the other end is connected to the source (or the drain) of the second transistor T2.

There are following two ways to achieve deterministic magnetization switching without the action of an external applied auxiliary magnetic field, i.e., field-free magnetization switching, when injecting a current to the first magnetic tunnel junction MTJ0 and the second magnetic tunnel junction MTJ1.

In some embodiments, when a current pulse is applied to the WL, i.e., when the current is injected, an action of a spin-orbit torque is generated to the ferromagnetic free layers 202 due to a spin-orbit coupling effect in the spin-orbit coupling layers 201 of the first magnetic tunnel junction MTJ0 and the second magnetic tunnel junction MTJ1, thereby causing a ratio of a field-like torque and a damping-like torque of the ferromagnetic free layer 202 to change. Furthermore, when the ratio of the field-like torque and a damping-like torque ($\lambda_{FL}/\lambda_{DL}$) satisfies a first preset condition, a deterministic magnetization switching without the assistance of an external applied magnetic field, i.e., field-free magnetization switching, can be achieved to cause a deterministic switching of resistance states of the first magnetic tunnel junction and the second magnetic tunnel junction.

The first preset condition is that $\lambda_{FL}/\lambda_{DL} \geq 2$.

Figure 3A:
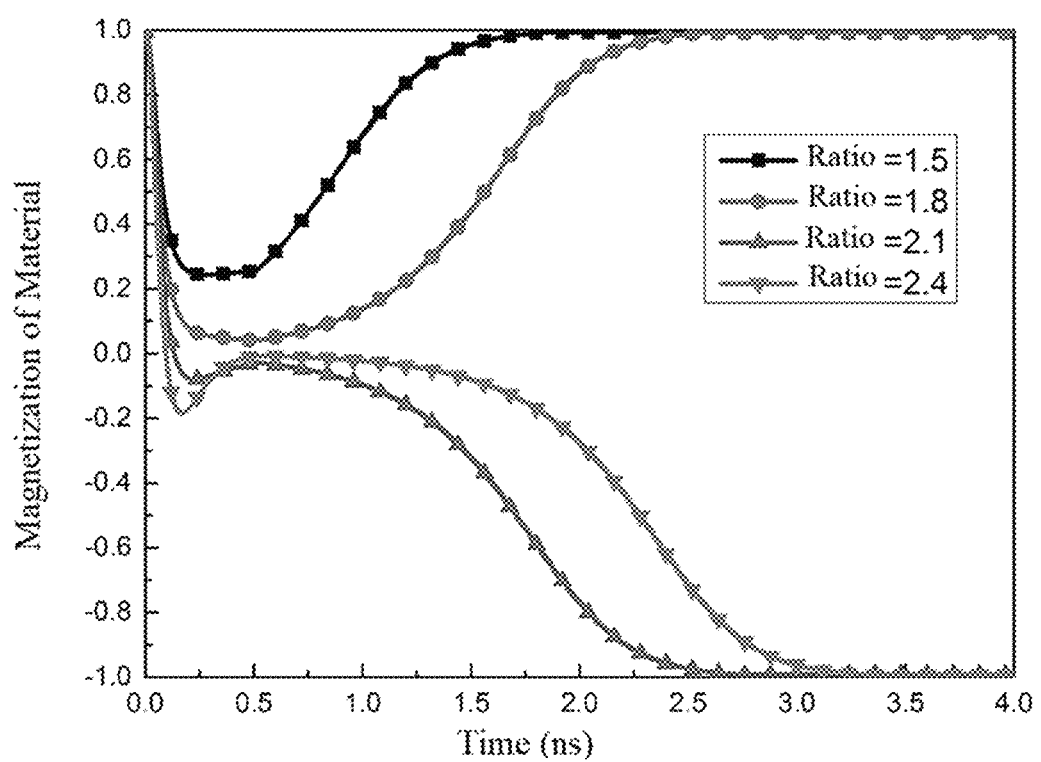
FIG. 3A is a schematic diagram of the variation of material magnetization over time when only a ratio of a field-like torque and a damping-like torque is adjusted, according to one or more embodiments of the present disclosure.

Specifically, as shown in FIG. 3A, when a switching current pulse with a density of J=1.2×10$^{12}$ A/cm$^2$ and a pulse width of 0.5 ns is applied to the WL, an image of the material magnetization m$_z$ as a function of time is obtained by adjusting the change in the ratio of the field-like torque and a damping-like torque ($\lambda_{FL}/\lambda_{DL}$) of the ferromagnetic free layer 202. For the ferromagnetic materials with perpendicular anisotropy employed in the present disclosure, i.e., any one of CoFeB, Co$_2$FeAl, Co, CoFe, Fe$_3$GeTe$_2$ and Ni$_3$GeTe$_2$, in case of $\lambda_{FL}/\lambda_{DL} < 2$, the material magnetization m$_z$ oscillates at one side of the initial magnetization direction and fails to complete the deterministic switching; and in case of $\lambda_{FL}/\lambda_{DL} \geq 2$, the magnetization direction m$_z$ crosses the plane position from the initial direction, and gradually relaxes to a state opposite to the initial position at the falling edge of this current pulse (that is, the relaxation effect), and thus achieves a fast magnetization switching without an external applied magnetic field, which in turn enables the control of data writing by adjusting or controlling the ratio of $\lambda_{FL}/\lambda_{DL}$.

The aforementioned magnetization switching refers to the magnetization direction of the ferromagnetic free layer being parallel or anti-parallel to the magnetization direction of the ferromagnetic reference layer in the magnetic tunnel junction.

Figure 3B:
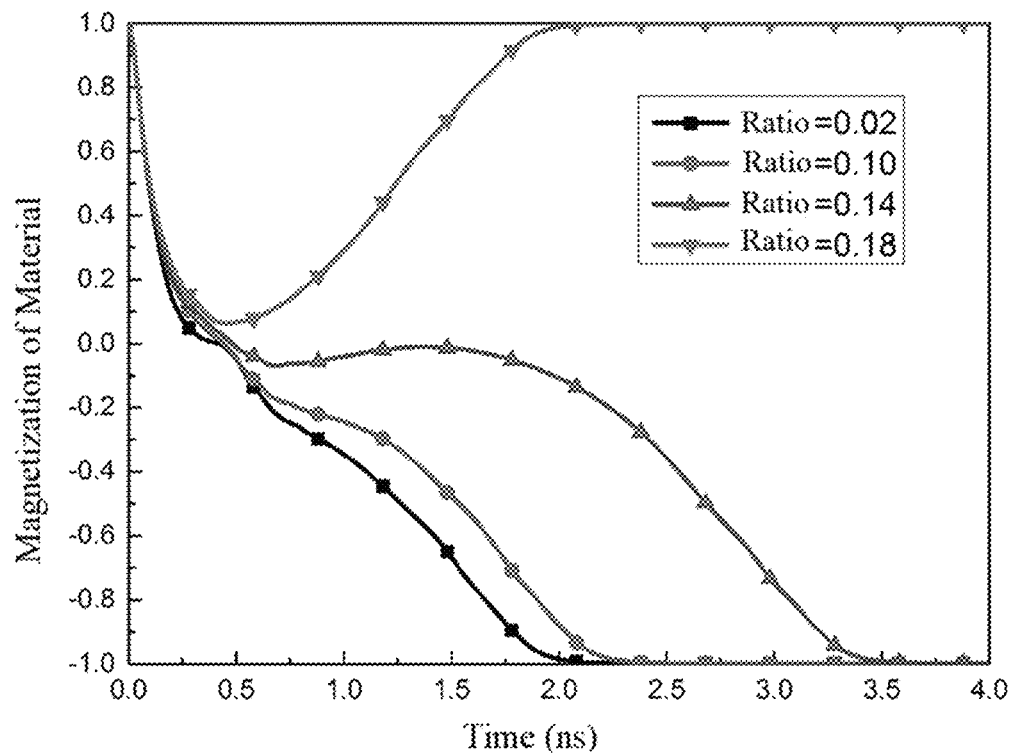
FIG. 3B is a schematic diagram of the variation of material magnetization over time when strength of the antisymmetric exchange interaction between the ferromagnetic free layer and the spin-orbit coupling layer and the ratio of the field-like torque and the damping-like torque are simultaneously adjusted, according to one or more embodiments of the present disclosure.

In some implementations, as shown in FIG. 3B, first, a coefficient of antisymmetric exchange interaction (Dzyaloshinskii-Moriya interaction) between the spin-orbit coupling layers 201 and the ferromagnetic free layers 202 in the two magnetic tunnel junctions is adjusted, and at the same time, the ratio of the field-like torque and the damping-like torque ($\lambda_{FL}/\lambda_{DL}$) of the ferromagnetic free layer 202 is adjusted, then both of them work together to achieve a fast magnetization switching in the absence of an external applied magnetic field, i.e., field-free magnetization switching.

Wherein the DM interaction coefficient is controlled to satisfy 0.2~0.3 mJ/m², and the current is injected into the spin-orbit coupling layers 201 of the first magnetic tunnel junction MTJ0 and the second magnetic tunnel junction MTJ1 via the WL, so as to achieve deterministic magnetization switching without the action of the external applied auxiliary magnetic field when the ratio of the field-like torque and the damping-like torque satisfies the second preset condition, thereby enabling a deterministic switching of the resistance states of the first magnetic tunnel junction and the second magnetic tunneling junction.

In some implementations, when a switching current pulse with a density of J=1.2×10¹² A/cm² and a pulse width of 0.5 ns is applied through the WL, and at the same time, the DM interaction coefficient D is adjusted to 0.2 mJ/m² (i.e., D=0.2 mJ/m²), it can be seen that the required $\lambda_{FL}/\lambda_{DL}$ ratios for fast switching without the external applied magnetic field are 0.02, 0.1, and 0.14. The required ratios ($\lambda_{FL}/\lambda_{DL}$) in this implementation are greatly reduced compared to the implementation of FIG. 3A, in which $\lambda_{FL}/\lambda_{DL} \geq 2$. It is more convenient to adjust and control. Thus, this second preset condition above may be $\lambda_{FL}/\lambda_{DL}=0.02$, $\lambda_{FL}/\lambda_{DL}=0.1$, and $\lambda_{FL}/\lambda_{DL}=0.14$.

Furthermore, the adjustment of the antisymmetric exchange interaction coefficient between the spin-orbit coupling layer and the ferromagnetic free layer is performed, specifically by adjusting the thickness of the spin-orbit coupling layer, or the stress distribution, roughness or interfacial electron energy band structure between the spin-orbit coupling layer and the ferromagnetic free layer.

When the word line is set as the high voltage level and the current is input into the memory cell, the first magnetic tunnel junction and the second magnetic tunnel junction form different resistance states by using any of the above means of achieving deterministic magnetization switching, such that the writing of one bit of binary information is achieved.

Wherein, when the magnetization directions of the ferromagnetic free layer and the ferromagnetic reference layer of the magnetic tunnel junction are parallel to each other, the magnetic tunnel junction forms a low resistance state, representing a binary information '0', and when the magnetization directions of the ferromagnetic free layer and the ferromagnetic reference layer of the magnetic tunnel junction are anti-parallel to each other, the magnetic tunnel junction forms a high resistance state, representing a binary information '1'.

Prior to the first data write, the memory cell needs to be initialized, including: turning on the first transistor T1 and the third transistor T3, turning off the second transistor T2, and the source line, and then applying a gate voltage to the WL to input a current pulse to the first magnetic tunnel junction MTJ0 and the second magnetic tunnel junction MTJ1, such that the first magnetic tunnel junction MTJ0 and the second magnetic tunnel junction MTJ1 are both under the action of the spin transfer torque (STT) effect generated by the initialization current pulse, causing the first magnetic tunnel junction to form a first resistance state and the second magnetic tunnel junction to form a second resistance state, and the first resistance state and the second resistance state are opposite resistance states.

In some implementations, in this initialization process, the first transistor T1 and the third transistor T3 are turned on by applying the gate voltage to the WL, at this point, the read/write control line (R/W Ctrl) is at a low voltage level, both the source line SL and the second transistor T2 are turned off, the first bit line BL1 connected to the drain of the first transistor T1 is at a high voltage level, and the second bit line BL2 connected to the drain of the third transistor T3 is at a low voltage level. The current flows through the first magnetic tunnel junction MTJ0 and the second magnetic tunnel junction MTJ1, which generates a spin transfer torque (STT) effect, causing the first magnetic tunnel junction MTJ0 and the second magnetic tunnel junction MTJ1 to form opposite resistance states, i.e., MTJ0 is '1' and MTJ1 is '0'; or MTJ0 is '0' and MTJ1 is '1', which depends on the magnetization direction of the ferromagnetic reference layer.

When performing data writing, the read/write control line (R/W Ctrl) and the word line are controlled to be at the high voltage level, the first transistor T1, the second transistor T2 and the third transistor T3 are controlled to turn on, so that both the first magnetic tunnel junction MTJ0 and the second magnetic tunnel junction MTJ1 to generate the spin-orbit torque (SOT) effect, causing the first magnetic tunnel junction MTJ0 to form the second resistance state and the second magnetic tunnel junction MTJ1 to form the first resistance state.

In some implementations, when the read/write control line (R/W Ctrl) is at the high voltage level, the second transistor T2 is turned on, and when the current passes through the spin-orbit coupling layer 201 of the magnetic tunnel junction corresponding to the smaller electric resistance (i.e., the magnetic tunnel junction with '0' resistance state), a spin current is generated under the spin-orbit coupling effect (STT), therefore a torque action is generated on the ferromagnetic materials of the ferromagnetic free layer. When the ratio ($\lambda_{FL}/\lambda_{DL}$) of the field-like torque and the damping-like torque of the ferromagnetic free layer 202 satisfies a preset condition (the first preset condition or the second preset condition), the magnetization directions $m_z$ of the ferromagnetic free layer in the first magnetic tunnel junction MTJ0 and the second magnetic tunnel junction MTJ1 are flipped to the opposite resistance state to the initialized resistance state at the same time, and at this moment, the data writing is realized.

Figure 4:
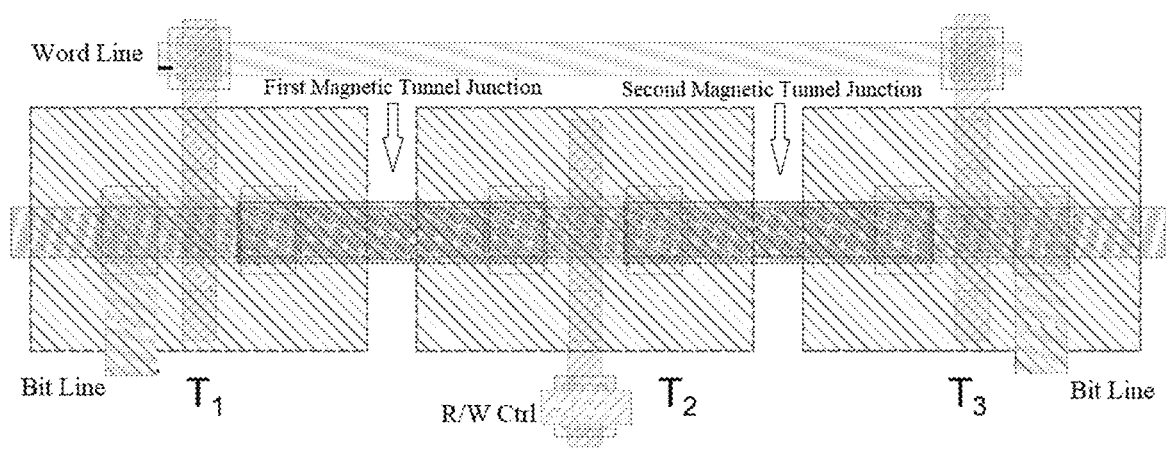
FIG. 4 is a schematic diagram of the layout design structure of a self-reference storage structure according to one or more embodiments of the present disclosure.

A design layout of the self-reference storage structure is shown in FIG. 4.

Figure 5:
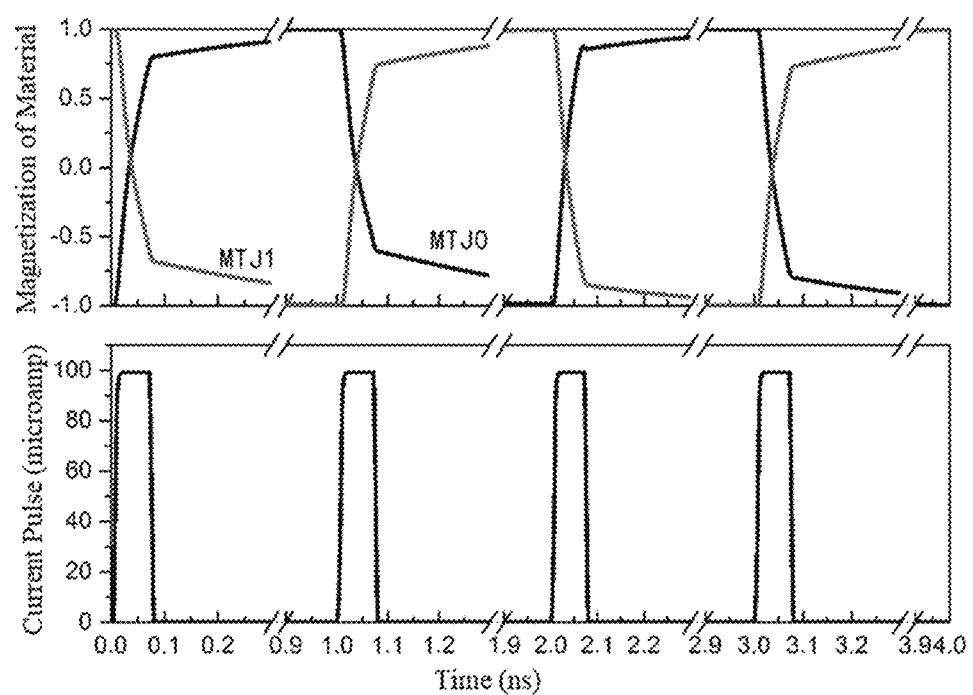
FIG. 5 is a schematic diagram of the magnetization switching characteristics of a ferromagnetic free layer when a current pulse is injected to the self-reference storage structure, according to one or more embodiments of the present disclosure.

As shown in FIG. 5, a diagram of the magnetization switching in the magnetic tunnel junction by applying a high voltage level on the word line (WL) and under the action of a write current pulse is shown.

In some implementations, the WL is set as a high voltage level and a current pulse with a very short rising edge time (10 ps) is applied in the spin-orbit coupling layer of the magnetic tunnel junction, thus achieving magnetization switching without the action of an external applied auxiliary magnetic field, i.e., field-free magnetization switching. The current pulse is injected again after the magnetization direction $m_z$ is flipped, and the switching process is repeated, which achieves the reverse magnetization switching process and thus makes the magnetization switching controllable.

Since the injection of current pulses causes a rapid switching of magnetization direction $m_z$, and the switching effect is not sensitive to the width of the current pulse, so it is not necessary to keep the current for a long time, thereby making the power consumption of device reduced. Therefore, the process of achieving fast magnetization switching during data writing makes the response speed of device improved a lot and achieves low time latency and low power consumption.

One or more technical solutions of the self-reference storage structure provided in the present disclosure include: three transistors, including a first transistor, a second transistor and a third transistor; two magnetic tunnel junctions, including a first magnetic tunnel junction and a second magnetic tunnel junction; the first magnetic tunnel junction is connected in series between the first transistor and the second transistor, the second magnetic tunnel junction is connected in series between the second transistor and the third transistor, and when the first transistor, the second transistor, and the third transistor are controlled to turn on, the writing of information of one bit binary is realized, so that when performing the data storage, only a unidirectional current needs to be applied to realize the writing of one bit of binary data, and the device has low time latency, low power consumption, and high reading margin during data writing, thereby realizing high precision and reliable reading.

Figure 6:
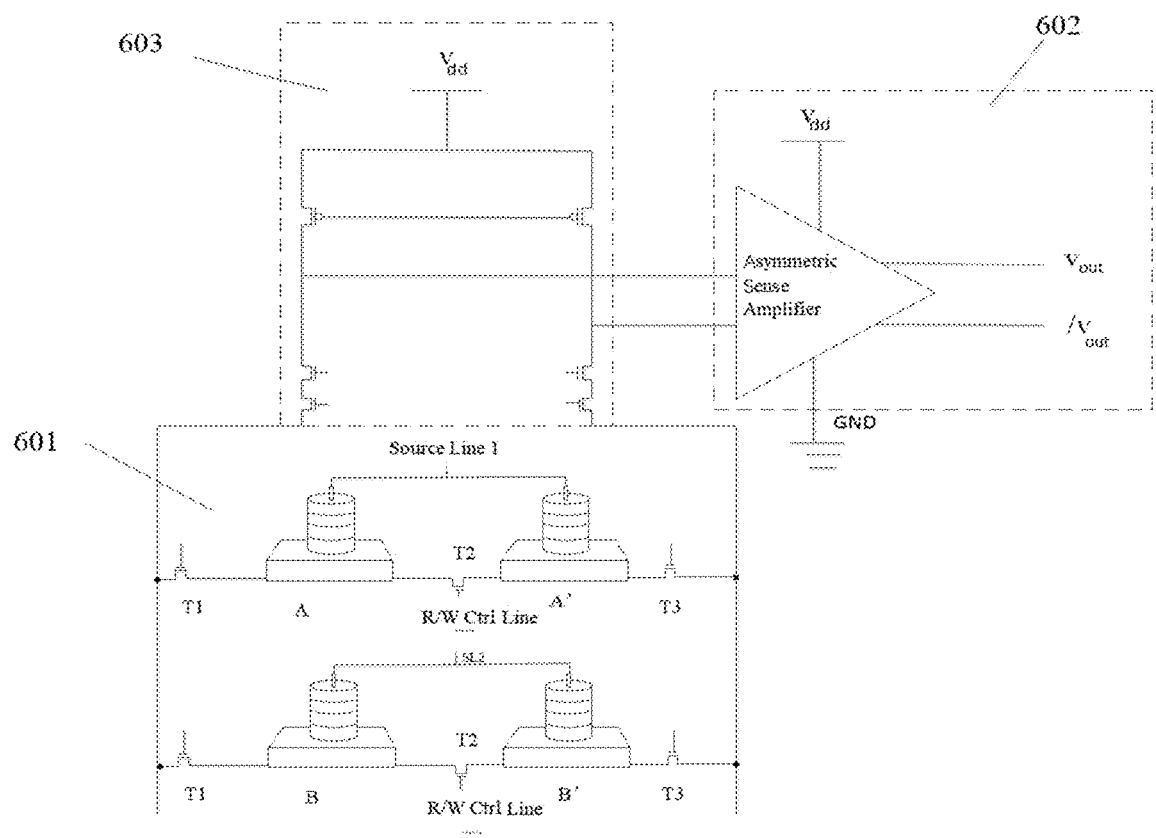
FIG. 6 is a schematic diagram of an in-memory computing circuit according to one or more embodiments of the present disclosure.

In another aspect of the present disclosure, there is provided an in-memory computing circuit, as shown in FIG. 6. The in-memory computing circuit may include: a memory cell 601, an asymmetric sense amplifier 602 and a voltage generation circuit 603.

The memory cell 601 includes a plurality of self-reference storage structures connected in parallel, and the memory cell 601 generates a voltage difference between an induction voltage and a reference voltage under an action of a current.

The asymmetric sense amplifier 602 includes two transistors of different sizes.

The voltage generation circuit 603 is connected between the memory cell 601 and the asymmetric sense amplifier 602 for inputting the voltage difference between the induction voltage and the reference voltage into the asymmetric sense amplifier 602 to implement data reading with high read margin and logic operation functions.

As an example, a set of self-reference storage structures are selected for reading data.

When performing a data read operation, a supply voltage $V_{dd}$ is applied to the top of the voltage generation circuit 603, so that the memory cell 601 generates a voltage difference between the induction voltage and the reference voltage, and the voltage difference is input to the asymmetric sense amplifier 602, and, based on the difference in the discharge rate of two transistors of different sizes in the asymmetric sense amplifier, the two inverted output terminals of the asymmetric sense amplifier 602 generate complementary outputs as a result, which enables reading data.

Specifically, in case of applying $V_{dd}$ to a supply terminal of the voltage generation circuit 603, currents flowing through the resistances of the first magnetic tunnel junction MTJ0 and the resistance of the second magnetic tunnel junction MTJ1 in the selected set of self-reference storage structures are different due to the resistance difference between the resistance of the first magnetic tunnel junction MTJ0 and the resistance of the second magnetic tunnel junction MTJ1, so that the current difference between currents of paths respectively corresponding to resistances of the first magnetic tunnel junction MTJ0 and the second magnetic tunnel junction MTJ1 is converted into a voltage difference, which can be written as:

$$V_L = V_{dd} - V_{clamp}/R_{mtj} \times R_{load}$$

$$V_R = V_{dd} - (V_{clamp}/R_{ap} = V_{clamp}/R_p)/2 \times R_{load}$$

$V_{clamp}$ is a clamp voltage applied to an induction path where the resistance of the first magnetic tunnel junction MTJ0 is located and a reference path where the second magnetic tunnel junction MTJ1 is located, and the clamp voltage is used to ensure that both paths have the same voltage drop. $V_L$ is an induction voltage and $V_R$ is a reference voltage.

$R_p$ is a resistance when magnetization directions of the ferromagnetic free layer and the ferromagnetic reference layer are parallel, and Rap is a resistance when magnetization directions of the ferromagnetic free layer and the ferromagnetic reference layer are anti-parallel.

Furthermore, $V_{access}$ and the word line (WL) are controlled to select any set of self-reference storage structures.

The two inverted output terminals of the asymmetric sense amplifier PCSA are pre-charged to $V_{dd}$ at the initial stage, and after pulling a read enable signal to the high voltage level, the gate control voltage generated by the first magnetic tunnel junction MTJ0 and the second magnetic tunnel junction MTJ1 as mentioned above is used to turn on the transistors for discharging, and the difference in the discharge rates will produce complementary outputs, i.e., outputs through the terminals Vout and /Vout, thereby the read operation is achieved.

Figure 7A:
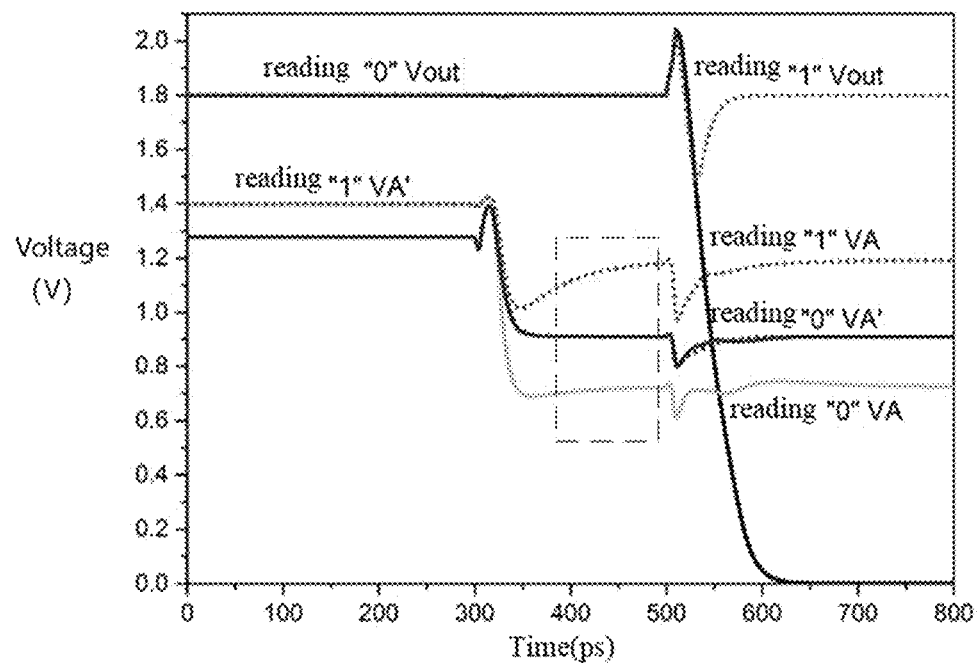
FIG. 7A is a first schematic diagrams comparing read results using a conventional 2T1M and a self-reference storage structure in the present disclosure, according to one or more embodiments of the present disclosure.
Figure 7B:
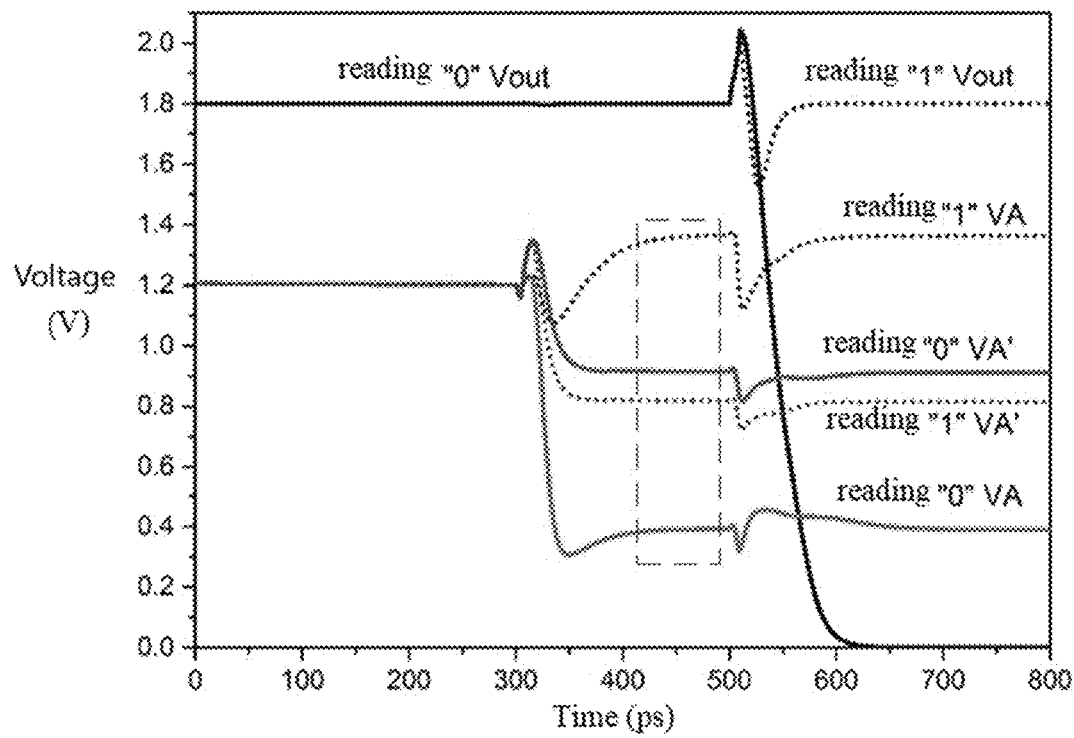
FIG. 7B is a second schematic diagram comparing read results using a conventional 2T1M and a self-reference storage structure in the present disclosure, according to one or more embodiments of the present disclosure.

The read results of the 2T1R structure used in the prior art are compared with the 3T2MTJ structure used in the present disclosure, as shown in FIG. 7A and FIG. 7B, wherein the dashed line indicates a read result of '1' and the solid line indicates a read result of '0'. By setting both of $V_{access}$ and the WL at the high voltage level at 300 ps, the induction voltage and the reference voltage outputted are used as gate voltages of the two transistors of the asymmetric sense amplifier 602 to control discharge rates of these two transistors ($T_1'$ and $T_2'$). Thus, the voltage difference between a branch where the first magnetic tunnel junction MTJ0 is located and a branch where the second magnetic tunnel junction MTJ1 is located is called as a read margin, as shown in dashed boxes of FIG. 7b and FIG. 7a. Compared with that of FIG. 7A, the present disclosure has a larger read margin, which is shown in the dashed box of FIG. 7b, and therefore, the technical solution of the present disclosure has a higher read reliability.

Figure 7C:
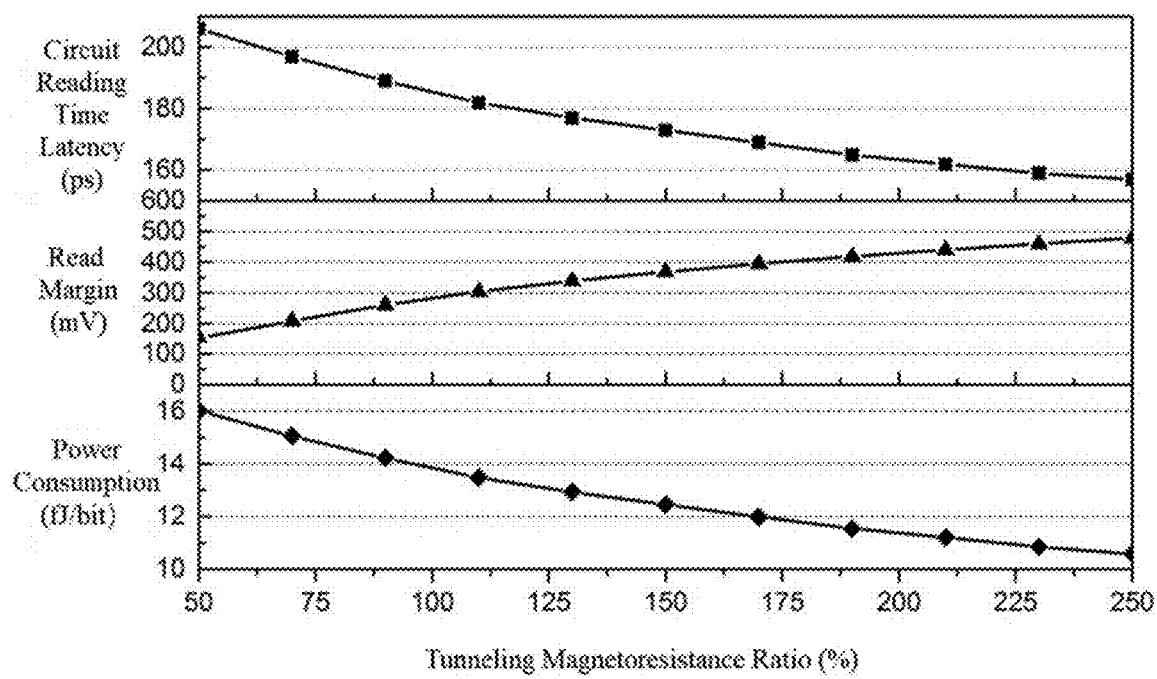
FIG. 7C is a schematic diagram comparing read time latency, power consumption, and read margin of the circuit in case of different TMR, according to one or more embodiments of the present disclosure.

As shown in FIG. 7C, by comparing the circuit reading time latency (Latency), power consumption (Power Consumption) and reading margin (Sensing Margin) under different tunneling magneto-resistance ratio (TMR), it can be seen that the value of TMR is inversely proportional to the circuit time latency, the value of TMR is also inversely proportional to the power consumption, and the value of TMR is positively proportional to the reading margin. Therefore, the larger the TMR, the lower the circuit latency, the lower the power consumption, and the higher the reading margin, which is more conducive to practical applications.

In FIG. 7c, the corresponding time latency is 120 ps at 250% TMR, which is faster than 287 ps at 50% TMR.

Figure 8:
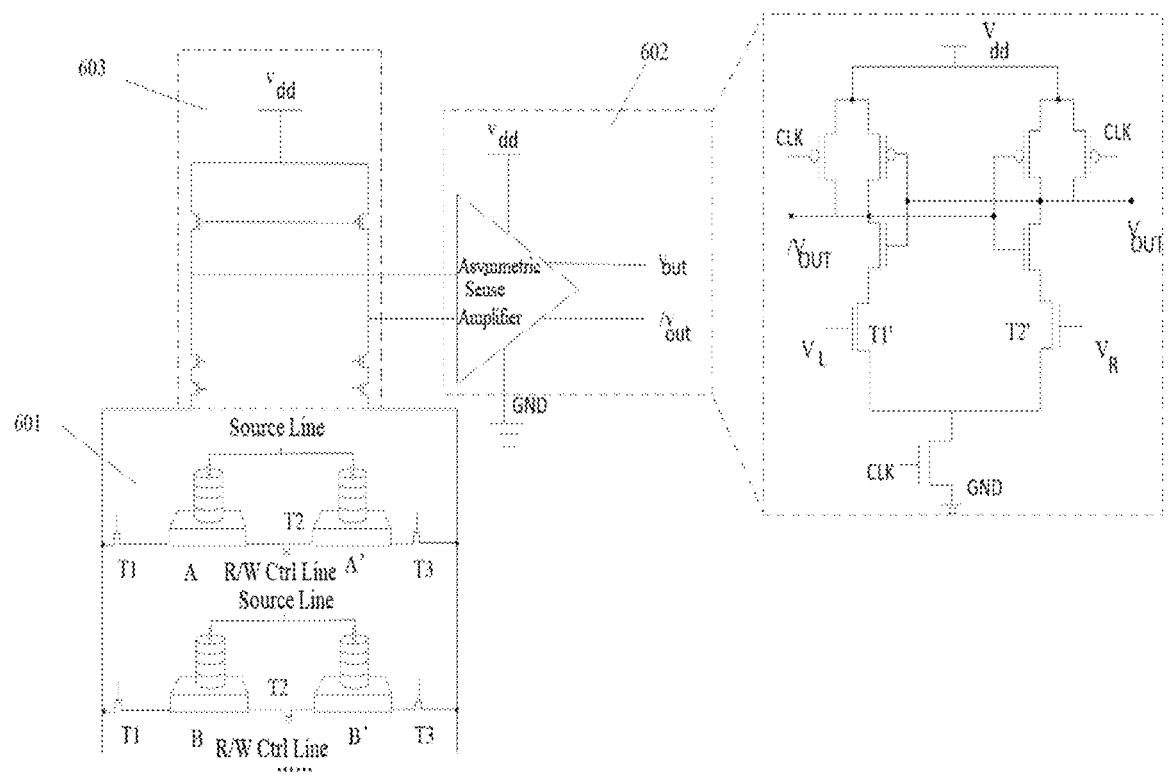
FIG. 8 is a diagram of the internal structure of an asymmetric sense amplifier according to one or more embodiments of the present disclosure.

The internal structure of the asymmetric sense amplifier PCSA is shown in FIG. 8, with any two sets of self-reference storage structures (A, A' and B, B') selected. The asymmetric sense amplifier PCSA includes transistors T1' and T2' of different sizes, wherein the transistor T1' has a channel length $L_1=60$ nm and a channel width $W_1=120$ nm, and the transistor T2' has a channel length $L_2=60$ nm and a channel width $W_2=180$ nm.

Any two self-reference storage structures in the same column are selected, and at the same time, the word lines WL1 and WL2 are strobed, so that the two selected self-reference storage structures exist in four storage states, i.e., '00', '11', '01', '10', corresponding to three voltage output states $V_O$, i.e., '$V_O$'=$V_{00}$, ($V_{01}$, $V_{10}$), $V_{11}$.

The reading is performed based on the four storage states existing in the two self-reference storage structures, and the logic operation is implemented based on the reading results and the principle of the asymmetric sense amplifier PCSA.

For the implementation of AND operation, the logic operation is as follows.

In case of treating the induction voltage $V_L$ as the gate voltage of transistor $T_1$' and treating the reference voltage $V_R$ as the gate voltage of transistor $T_2$':

When '$V_O$'=$V_{00}$, the induction voltage $V_L$ is smaller than the reference voltage $V_R$, so the discharge rate for driving transistor $T_1$' is smaller than that of transistor $T_2$', and $V_{out}$ outputs '0'.

When '$V_O$'=$V_{11}$, the induction voltage $V_L$ is greater than the reference voltage $V_R$, so the discharge rate for driving transistor $T_1$' is greater than that of transistor $T_2$', and $V_{out}$ outputs '1'.

When '$V_O$'=$V_{01}$ or $V_{10}$, the induction voltage $V_L$ is equal to the reference voltage $V_R$, and since the channel width of transistor $T_1$' is smaller than the channel width of transistor $T_2$', the discharge rate of transistor $T_1$' is smaller than the discharge rate of transistor $T_2$', and $V_{out}$ outputs '0'. Thus, AND operation is implemented, and the corresponding /$V_{out}$ realizes NAND operation.

For the implementation of OR operation, the logic operation is as follows.

In case of treating the induction voltage $V_L$ as the gate voltage of transistor $T_2$' and treating the reference voltage $V_R$ as the gate voltage of transistor $T_1$':

When '$V_O$'=$V_{00}$, the induction voltage $V_L$ is smaller than the reference voltage $V_R$, so the discharge rate for driving transistor $T_2$' is smaller than that of transistor $T_1$', and $V_{out}$ outputs '0'.

When '$V_O$'=$V_{11}$, the induction voltage $V_L$ is greater than the reference voltage $V_R$, so the discharge rate for driving transistor $T_2$' is greater than that of transistor $T_1$', and $V_{out}$ outputs '1'.

When '$V_O$'=$V_{01}$ or $V_{10}$, the induction voltage $V_L$ is equal to the reference voltage $V_R$, and since the channel width of transistor $T_2$' is greater than the channel width of transistor $T_1$', the discharge rate of transistor $T_2$' is greater than the discharge rate of transistor $T_1$', and $V_{out}$ outputs '1'. Thus, OR operation is implemented, and the corresponding /$V_{out}$ realizes NOR operation.

In the case that the induction voltage $V_L$ that inputted into the transistor $T_1$' is greater than the reference voltage $V_R$ that inputted into the transistor $T_2$', the on-state current corresponding to transistor $T_1$' is higher, and therefore, the corresponding discharge rate is faster.

Figure 9:
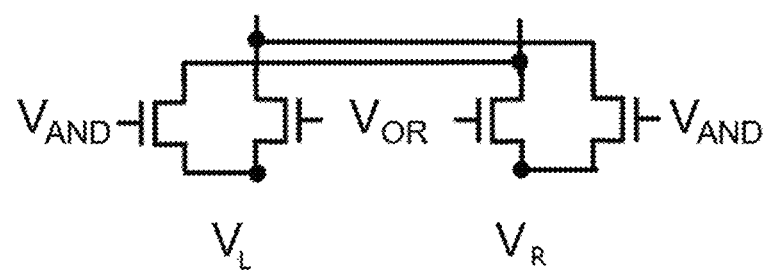
FIG. 9 is a schematic diagram of a conversion circuit that implements different logic operation switches according to one or more embodiments of the present disclosure.

Specifically, when inputting the induction voltage $V_L$ and the reference voltage $V_R$ into the asymmetric sense amplifier, for AND operation and OR operation, it is necessary to switch directions of the induction voltage $V_L$ and the reference voltage $V_R$, and a conversion circuit shown in FIG. 9 is needed. The conversion circuit is arranged between the output terminals of the induction voltage and the reference voltage and the asymmetric sense amplifier, to turn on a corresponding transistor when realizing OR or AND operation, so as to realize the interchange of the control gate voltage of the asymmetric sense amplifier $T_1$' and $T_2$'.

Figure 10A:
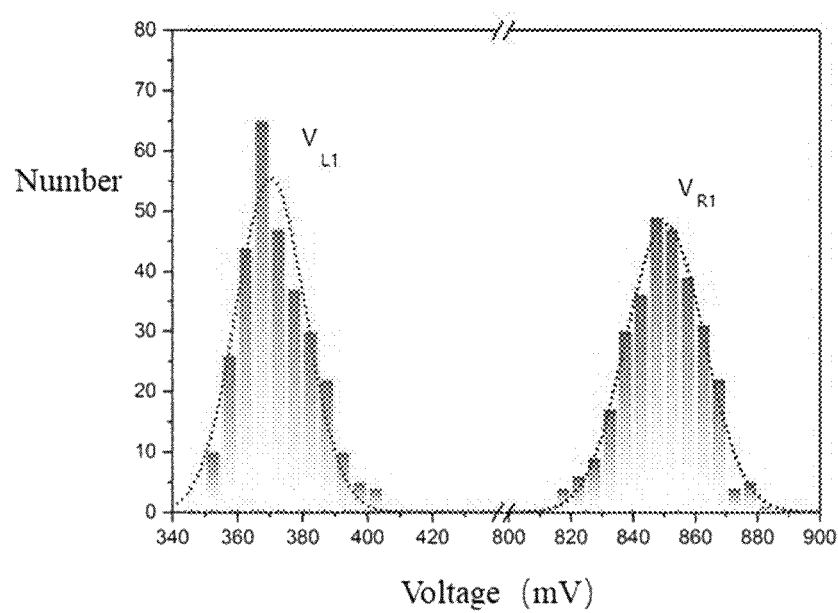
FIG. 10A is a first diagrams of the read voltage distribution in the case of simulating process fluctuations according to one or more embodiments of the present disclosure.
Figure 10B:
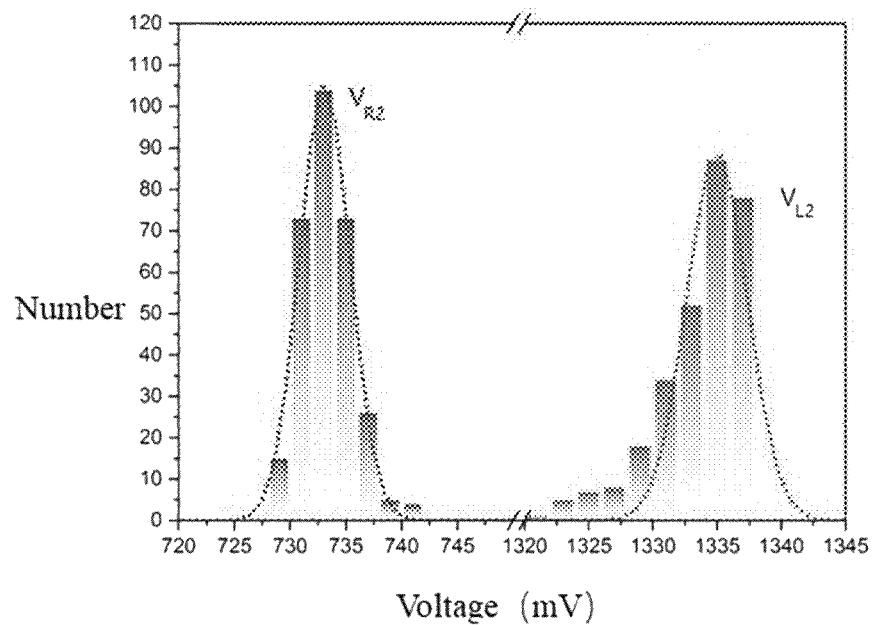
FIG. 10B is a second diagram of the read voltage distribution in the case of simulating process fluctuations according to one or more embodiments of the present disclosure.

As shown in FIG. 10A and FIG. 10B, the voltage distribution condition collected in case of simulating process fluctuations is shown. Among them, FIG. 10A corresponds to the induction voltage $V_{L1}$ and the reference voltage $V_{R1}$ corresponding to one storage structure, and FIG. 10B corresponds to the induction voltage $V_{L2}$ and the reference voltage $V_{R2}$ corresponding to another storage structure, and values of the corresponding induction voltage ($V_{L1}$, $V_{L2}$) and reference voltage ($V_{R1}$, $V_{R2}$) are simulated by changing process parameters. Based on the simulation result, it can be seen from FIG. 10A that the reading results of branches respectively corresponding to the induction voltage $V_{L1}$ and the reference voltage $V_{R1}$ do not overlap, thus ensuring the accuracy of the data reading in the case of process fluctuations.

Figure 11:
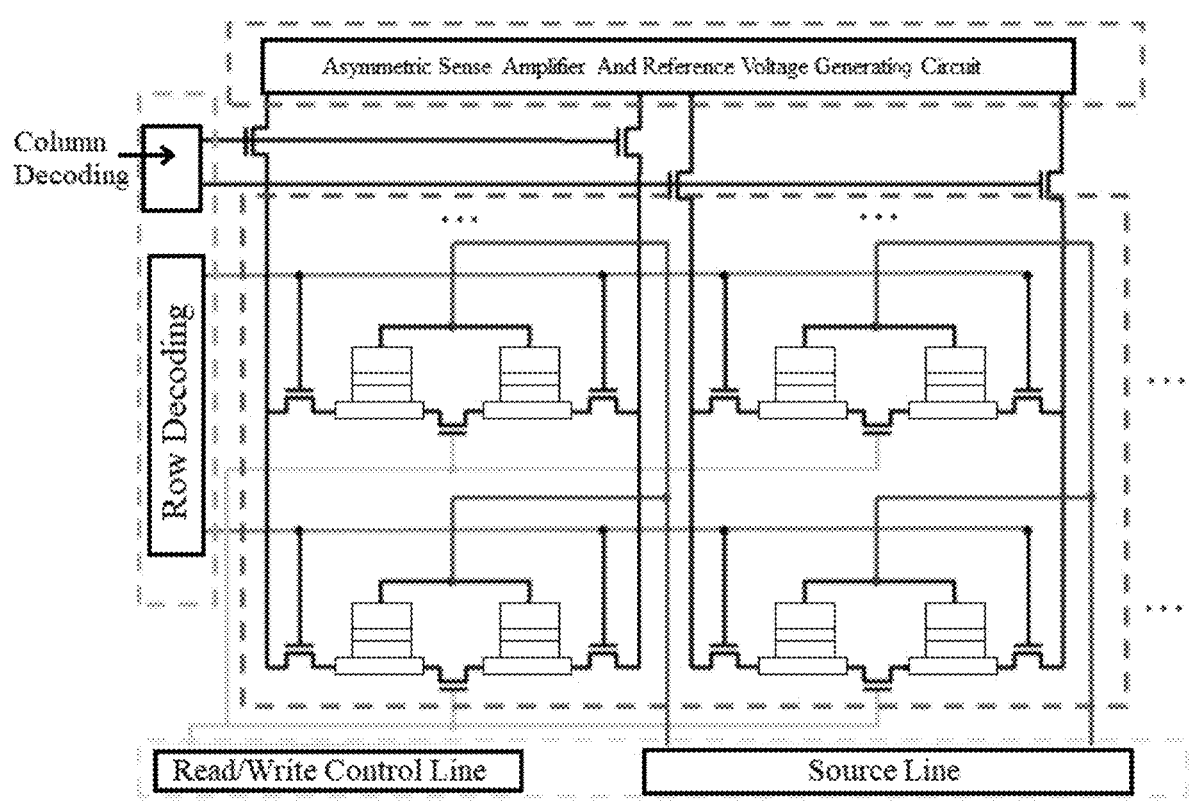
FIG. 11 is a circuit diagram of a memory array structure and peripheral circuit configuration according to one or more embodiments of the present disclosure.

As shown in FIG. 11, the in-memory computing circuit is capable of being used in large array applications, which may include a plurality of row memory cells, a plurality of column memory cells, a column decoder (RD), a row decoder (CD), a read/write control line (R/D Ctrl), a source line (SL Driver), and an asymmetric sense amplifier (PCSA) and a reference voltage generating circuit.

Wherein, the plurality of row memory cells and the plurality of column memory cells can be expanded in the XY direction, and the column decoder (RD) and the row decoder (CD) are used to control the strobing of the memory cell.

The read/write control line (R/D Ctrl) and the source line (SL Driver) control the reading and writing of the memory cell.

The combination of the asymmetric sense amplifier (PCSA) and the reference voltage generating circuit is used to implement the reading and the in-memory operations of the memory cell array. The reference voltage generating circuit includes a memory cell and a voltage generation circuit, and, based on the memory cell, the voltage generation circuit, and the asymmetric sense amplifier, the in-memory operation can realize the in-memory computing.

One or more technical solutions of the in-memory computing circuit provided in the present disclosure include: a memory cell, an asymmetric sense amplifier and a voltage generation circuit, wherein the memory cell includes a plurality of self-reference storage structures connected in parallel and generates a voltage difference under the action of a current, the asymmetric sense amplifier includes two transistors of different sizes, the voltage generation circuit is connected between the memory cell and the asymmetric sense amplifier for inputting the voltage difference into the asymmetric sense amplifier, so as to achieve the data reading with high read margin as well as logic operation functions. By using the self-reference storage structure constructed according to the present disclosure, the voltage difference at the output terminals of the memory cell is increased, that is, becomes larger, thereby achieving a high read margin and improving reading and operation performance.

In the above description, the technical details such as the composition and etching of each layer are not described in detail. However, it should be understood by those skilled in the art that various technical means can be used to form layers, regions, etc. of the desired shape. Furthermore, in order to form the same structure, a person skilled in the art can design a method that is not identical to the method described above. Furthermore, although each embodiment is described separately above, this does not mean that the measures in each embodiment cannot be advantageously used in combination.

Obviously, a person skilled in the art can make various changes and variations of the present disclosure without departing from the spirit and scope of the present disclosure. Thus, if such modifications and variations of the present disclosure are within the scope of the claims of the present disclosure and their technical equivalents, the present disclosure is intended to include such modifications and variations as well.

What is claimed is:

1. A self-reference storage structure, comprising:
three transistors comprising a first transistor, a second transistor and a third transistor; and
two magnetic tunnel junctions comprising a first magnetic tunnel junction and a second magnetic tunnel junction;
wherein the first magnetic tunnel junction is connected in series between the first transistor and the second transistor;
the second magnetic tunnel junction is connected in series between the second transistor and the third transistor; and
one bit of binary information is written when the first transistor, the second transistor and the third transistor are controlled to turn on;
wherein the first magnetic tunnel junction and the second magnetic tunnel junction both comprise:
a spin-orbit coupling layer, a ferromagnetic free layer, a tunneling layer, a ferromagnetic reference layer, and a top electrode, from bottom to top,
wherein the ferromagnetic free layer and the ferromagnetic reference layer are both any one of following magnetic materials having perpendicular anisotropies: CoFeB, $Co_2FeAl$, CO, CoFe, $Fe_3GeTe_2$, and $Ni_3GeTe_2$;
wherein the self-reference storage structure further comprises:
a word line, a first bit line, a second bit line, a read/write control line and a source line;
wherein a gate of the first transistor and a gate of the third transistor are both connected to the word line, and a gate of the second transistor is connected to the read/write control line;
the top electrode of the first magnetic tunnel junction and the top electrode of the second magnetic tunnel junction are both connected to the source line; and
a drain of the first transistor is connected to the first bit line, and a drain of the third transistor is connected to the second bit line.

2. The self-reference storage structure according to claim 1, wherein a ratio of a field-like torque and a damping-like torque of the ferromagnetic free layer is controlled to satisfy a first preset condition when injecting a current to spin-orbit coupling layers of the first magnetic tunnel junction and the second magnetic tunnel junction through the word line, to achieve a deterministic magnetization switching without an action of an external applied auxiliary magnetic field, so that a deterministic switching of resistance states of the first magnetic tunnel junction and the second magnetic tunnel junction occurs.

3. The self-reference storage structure according to claim 1, wherein an antisymmetric exchange interaction coefficient between the spin-orbit coupling layer and the ferromagnetic free layer is adjusted to satisfies 0.2~0.3 $mJ/m^2$; and
wherein a ratio of a field-like torque and a damping-like torque of the ferromagnetic free layer is controlled to satisfy a second preset condition when injecting a current to spin-orbit coupling layers of the first magnetic tunnel junction and the second magnetic tunnel junction through the word line, to achieve a deterministic magnetization switching without an action of an external applied auxiliary magnetic field, so that a deterministic switching of resistance states of the first magnetic tunnel junction and the second magnetic tunnel junction occurs.

4. The self-reference storage structure according to claim 1, wherein an initialization operation is performed before a write operation, and the initialization operation comprises:
turning on the first transistor and the third transistor, turning off the second transistor and the source line, and injecting an initialization current by applying a gate voltage to the word line, so that both of the first magnetic tunnel junction and the second magnetic tunnel junction generate a spin transfer torque effect, causing the first magnetic tunnel junction to form a first resistance state and the second magnetic tunnel junction to form a second resistance state, and the first resistance state and the second resistance state are opposite resistance states.

5. The self-reference storage structure according to claim 4, wherein performing the write operation comprises:
turning on the first transistor, the second transistor and the third transistor, controlling the read/write control line to be at a high voltage level, so that both of the first magnetic tunnel junction and the second magnetic tunnel junction generate a spin-orbit torque effect, causing the first magnetic tunnel junction to form the second resistance state and the second magnetic tunnel junction to form the first resistance state; and
applying a high voltage level to the word line to inject a write current pulse, enabling the first magnetic tunnel junction and the second magnetic tunnel junction to achieve the magnetization switching, so as to write data.

6. An in-memory computing circuit, comprising:
a memory cell, an asymmetric sense amplifier and a voltage generation circuit;
wherein the memory cell comprises a plurality of self-reference storage structures connected in parallel, and generates a voltage difference between an induction voltage and a reference voltage under an action of a current;
wherein the self-reference storage structure comprises: three transistors comprising a first transistor, a second transistor and a third transistor; and two magnetic tunnel junctions comprising a first magnetic tunnel junction and a second magnetic tunnel junction; the first magnetic tunnel junction is connected in series between the first transistor and the second transistor; the second magnetic tunnel junction is connected in series between the second transistor and the third transistor; and one bit of binary information is written when the first transistor, the second transistor and the third transistor are controlled to turn on;
the asymmetric sense amplifier comprises two transistors of different sizes;
the voltage generation circuit is connected between the memory cell and the asymmetric sense amplifier for inputting the voltage difference between the induction voltage and the reference voltage into the asymmetric sense amplifier to implement data read operation and logic operation functions.

7. The in-memory computing circuit according to claim 6, wherein performing the data read operation comprises:
applying a supply voltage to the voltage generation circuit to enable the memory cell to output the voltage difference; and inputting the voltage difference into the asymmetric sense amplifier to enable two inverted output terminals of the asymmetric sense amplifier to generate, based on a difference in discharge rates of the two transistors of different sizes in the asymmetric sense amplifier, complementary outputs, so as to achieve data reading.

8. The in-memory computing circuit according to claim 6, wherein performing the logic operation comprises:
turning on any two self-reference storage structures in the memory cell; and based on storage states of said any two self-reference storage structures and two transistors of different sizes in the asymmetrically sense amplifier, outputting, by the asymmetric sense amplifier, a logic operation result.

* * * * *